(12) United States Patent
Panakkal et al.

(10) Patent No.: US 10,914,780 B2
(45) Date of Patent: Feb. 9, 2021

(54) METHODS AND APPARATUSES FOR THRESHOLD VOLTAGE MEASUREMENT AND RELATED SEMICONDUCTOR DEVICES AND SYSTEMS

(71) Applicant: Micron Technology, Inc., Boise, ID (US)

(72) Inventors: Binoy Jose Panakkal, Kerala (IN); Rajesh N. Gupta, Karnataka (IN)

(73) Assignee: Micron Technology, Inc., Boise, ID (US)

( * ) Notice: Subject to any disclaimer, the term of this patent is extended or adjusted under 35 U.S.C. 154(b) by 103 days.

(21) Appl. No.: 16/227,348

(22) Filed: Dec. 20, 2018

(65) Prior Publication Data

US 2020/0200816 A1 Jun. 25, 2020

(51) Int. Cl.
*G01R 31/26* (2020.01)
*G05F 3/26* (2006.01)
*G01R 19/165* (2006.01)
*H03F 3/50* (2006.01)
*H03K 19/0948* (2006.01)

(52) U.S. Cl.
CPC ... *G01R 31/2621* (2013.01); *G01R 19/16528* (2013.01); *G05F 3/262* (2013.01); *H03F 3/50* (2013.01); *H03K 19/0948* (2013.01)

(58) Field of Classification Search
CPC ....... G01R 31/2621; G05F 3/262; H03F 3/50; H03K 19/0948
USPC ....................................................... 324/103
See application file for complete search history.

(56) References Cited

U.S. PATENT DOCUMENTS

| 4,124,475 | A | * | 11/1978 | Zetter | ................... | E21B 49/005 204/406 |
| 5,039,941 | A | | 8/1991 | Castro | | |
| 5,600,594 | A | * | 2/1997 | Padoan | ................. | G11C 29/50 365/185.2 |
| 5,792,944 | A | * | 8/1998 | Lennert | .............. | G01N 21/8483 73/64.43 |
| 9,989,582 | B2 | * | 6/2018 | An | ...................... | G01R 31/2621 |
| 2009/0066301 | A1 | * | 3/2009 | Oswald | ............... | H02M 3/1582 323/271 |
| 2009/0302812 | A1 | * | 12/2009 | Shor | ....................... | G05F 1/563 323/223 |
| 2014/0111280 | A1 | * | 4/2014 | Schuppener | ........ | H03F 3/45475 330/291 |
| 2014/0268909 | A1 | * | 9/2014 | Digiacomo | ....... | H02M 3/33553 363/21.04 |

(Continued)

*Primary Examiner* — Christopher P McAndrew
(74) *Attorney, Agent, or Firm* — TraskBritt (57) ABSTRACT

A measurement circuit may include a transistor having a first terminal, a second terminal, and a third terminal, wherein the first terminal is coupled to a first reference voltage. The measurement circuit may further include a first operational amplifier including a first input coupled to the second terminal of the transistor and an output coupled to the third terminal of the transistor. The first operational amplifier may further include a second input configured to receive a second reference voltage. The measurement circuit may also include a first unity-gain voltage follower including a second operational amplifier having a first input coupled to the first input of the first operational amplifier. Methods of measuring a threshold voltage, semiconductor devices, and electronic systems are also described.

23 Claims, 10 Drawing Sheets (56) References Cited

U.S. PATENT DOCUMENTS

| 2016/0005828 | A1* | 1/2016 | Kerber | H01L 29/0847 |
| | | | | 324/762.09 |
| 2017/0142798 | A1* | 5/2017 | Chiu | B62D 55/14 |
| 2018/0080960 | A1* | 3/2018 | Almosnino | G01R 19/0092 |

* cited by examiner

METHODS AND APPARATUSES FOR THRESHOLD VOLTAGE MEASUREMENT AND RELATED SEMICONDUCTOR DEVICES AND SYSTEMS

TECHNICAL FIELD

Embodiments of the disclosure relate to threshold voltage measurement, and, more specifically, to methods for measuring a threshold voltage of one or more transistors, circuits for such measuring, and related semiconductor devices and systems.

BACKGROUND

A field effect transistor (FET) is an electronic component that may be used in integrated circuits. A FET may include a conductive drain and a conductive source with a semiconductive channel region therebetween. A FET may further include a conductive gate adjacent to and separated from the semiconductor channel region by a gate insulator. Application of a suitable voltage (e.g., a threshold voltage) at the conductive gate may turn the transistor "on" and current may flow from the source to drain, or vice versa, through the channel region. When the voltage at the gate is removed, or reduced below the threshold voltage, the transistor may turn "off" and current is largely prevented from flowing through the channel region.

FETs have many applications, such as in memory, logic, and others. For example, FETs may be utilized in resistive random access memory (RRAM), dynamic random access memory (DRAM), other memory devices, and/or other integrated circuit applications. It may be desirable to accurately determine a threshold voltage of a FET.

DETAILED DESCRIPTION

Various embodiments of the disclosure relate to measurement circuits and associated methods for measuring a threshold voltage of one or more devices (e.g., one or more transistors). In some embodiments, a measurement circuit may be coupled to one or more transistors and may be used for testing and/or debugging purposes in a measurement mode (e.g., the measurement circuit may include a scribe structure). Further, in some embodiments, after testing and/or debugging, the one or more transistors may be, for example, taped out on silicon, disassociated with the measurement circuit, and used in an operational mode. In some embodiments, circuitry including the one or more transistors may transition from an operational mode to a measurement mode, and vice versa. Although various embodiments are described herein with reference to p-channel metal-oxide semiconductor (PMOS) transistors, embodiments of the disclosure may be applicable to other transistor configurations, such as n-channel metal-oxide semiconductor (NMOS) transistors.

A threshold voltage of a transistor may be a gate-to-source voltage at which a predetermined current flows across the transistor. Stated another way, a threshold voltage of a transistor may be a gate voltage that produces a predetermined magnitude of current flow between source and drain regions of the transistor. Some conventional devices and/or methods may measure a threshold voltage of a transistor via gradually ramping a gate voltage of the transistor while simultaneously monitoring current flow through the transistor. Once a predetermined current magnitude is reached (e.g., about 1 µA), ramping of the gate voltage may be halted and the threshold voltage may be recorded. This process is inherently slow since it requires multiple measurement points as the gate voltage is ramped up. In contrast to convention devices and methods, which may require multiple measurements, various embodiments of this disclosure are related to a single point measurement.

Figure 1:
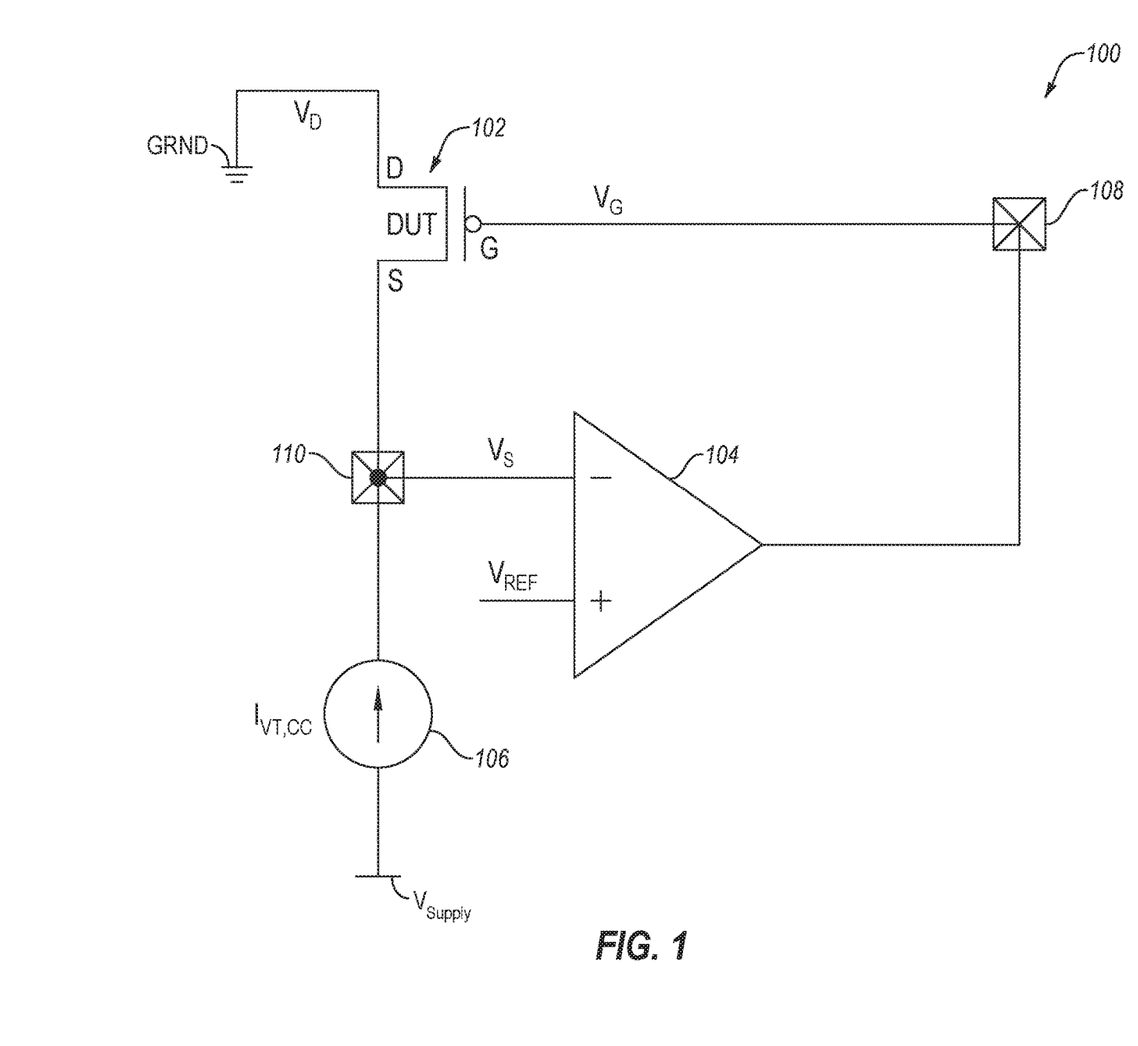
FIG. 1 depicts a measurement circuit including a transistor.

FIG. 1 depicts a measurement circuit 100 including a transistor 102, an operational amplifier 104, and a current source 106. Transistor 102, which may also be referred to as a device under test (DUT), includes a source S, a drain D, and a gate G. Circuit 100, which may include an integrated circuit, further includes pads 108 and 110. Pad 108 is positioned and configured to measure a voltage $V_G$ at gate G of transistor 102, and pad 110 is positioned and configured to measure a voltage $V_S$ at source S of transistor 102. More specifically, pad 108 may enable voltage $V_G$ to be measured ("probed") via an external instrument. Further, pad 110 may enable voltage $V_S$ to be measured ("probed") via an external instrument. Pads 108 and 110, and associated measurement cables (not shown in FIG. 1), have relatively large parasitic capacitances (e.g., 200-400 picofarads (pF)).

Due to the large parasitic capacitances of pads 108 and 110, and associated measurement cables, circuit 100 may not be feasible for high speed (e.g., sub-microsecond) threshold voltage measurements. More specifically, a large parasitic capacitance (e.g., due to pad 108 and associated measurement cables) in a feedback path of an operational amplifier 104 may limit measurement speeds and may cause stringent design constraints (e.g., for operational amplifier 104). Further, it may be difficult to stabilize operational amplifier 104 across process, temperature and voltage (PVT) variations. Moreover, a large compensation capacitor, requiring a large die area, may be required to stabilize operational amplifier 104.

Figure 2:
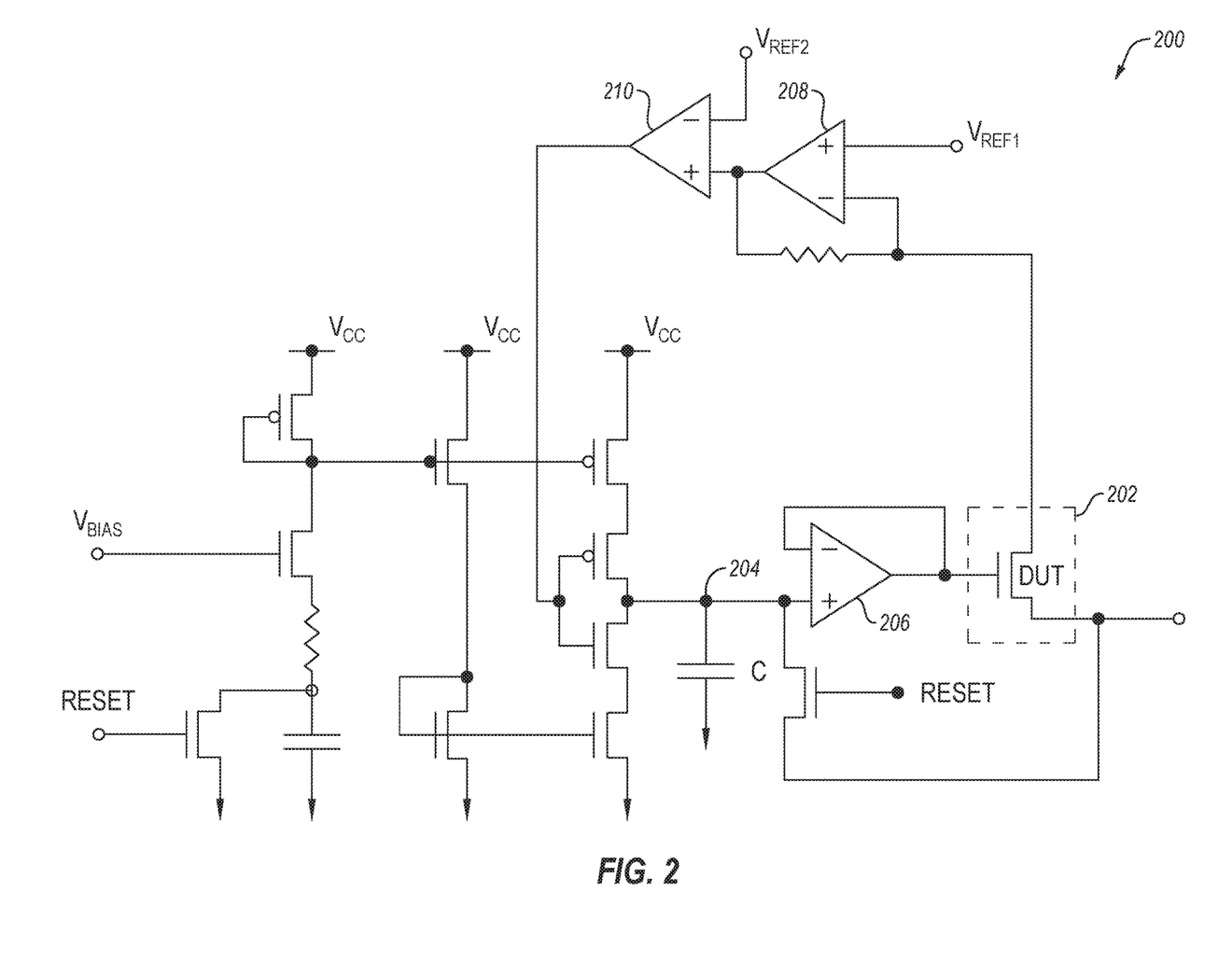
FIG. 2 depicts another measurement circuit including a transistor.

FIG. 2 depicts another measurement circuit 200, which may be used for measuring a threshold voltage of a transistor 202 (also referred to as a DUT). Like measurement circuit 100 of FIG. 1, measurement circuit 200 is not feasible for high speed (e.g., sub-microsecond) threshold voltage measurements due to large parasitic capacitances (200-400 pF) of a pad (e.g., at a node 204; pad not shown in FIG. 2) and associated measurement cables. A measurement time delay (i.e., for measuring the threshold voltage of transistor 202) is approximately five microseconds at 10 pF capacitance (i.e., at capacitor C). Further, assuming linear extrapolation for a 400 pF capacitance (i.e., due to a pad at node 204), a threshold voltage measurement may have a time delay of approximately 200 microseconds.

With continued reference to FIG. 2, a number of amplifying stages in a feedback path of circuit 200 may be eight (i.e., assuming operational amplifiers 206, 208, and 210 are 2-stage operational amplifiers). The number of amplifying stages may result in additional capacitive nodes in the feedback path and stringent circuit design constraints on operational amplifiers 206, 208, and 210 (i.e., to achieve the required phase margin across PVT variations). Further, large compensating capacitors may be required to achieve stability, thus requiring a larger area.

As described more fully herein, in contrast to conventional devices and methods, various embodiments as disclosed herein may have a reduced number of amplifying stages, and thus stabilization of a measurement circuit (e.g., across PVT variations) may be simplified, and design constraints for maintaining stability across PVT variations may be relaxed. Further, due to a reduction of capacitance in a feedback path of a measurement circuit, an area required for the measurement circuit may also be reduced compared to conventional measurement circuits. Moreover, various embodiments may allow for a threshold voltage of a device (e.g., a transistor) to be measured with a sub-microsecond delay across wide a range of supply currents (e.g., from substantially 10 nA to substantially 1 mA).

Figure 3:
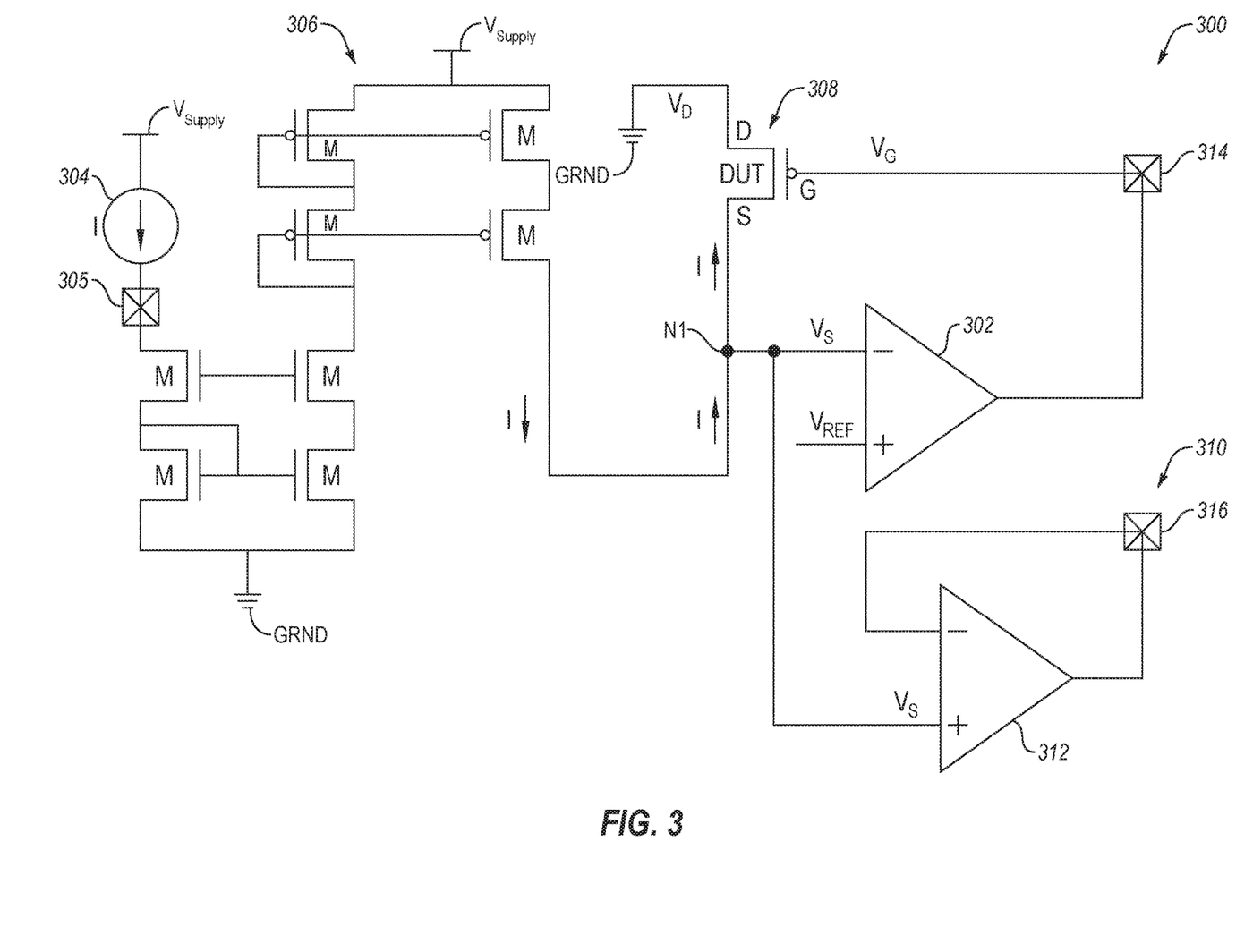
FIG. 3 illustrates a measurement circuit, according to one or more embodiments of the disclosure.

FIG. 3 illustrates a circuit 300, according to one or more embodiments of the disclosure. Circuit 300, which may also be referred to herein as a "measurement circuit," includes an operational amplifier 302, and a current source 304. Circuit 300 may be coupled to a voltage supply $V_{Supply}$ and a ground GRND (also referred to herein as a "reference voltage"). Circuit 300 further includes a current mirror 306, which, in this embodiment, includes a number of transistors M. In some embodiments, transistors M may include N-channel metal-oxide-semiconductor field-effect transistors (MOSFETs), P-channel MOSFETs, or any combination thereof. Current mirror 306 is provided as an example current mirror, and other current mirrors are within the scope of the present disclosure.

In some embodiments, circuit 300 may be an integrated circuit (e.g., formed on silicon), and current source 304 may be an external component (e.g., an external current source). In these embodiments, circuit 300 may include a pad 305 for coupling to current source 304. Current source 304 may generate a current I (e.g., 1 milliamp).

Circuit 300 further includes a transistor 308 (also referred to herein as a DUT), which has a gate G, a source S, and a drain D. Gate G, source S, and drain D may each be referred to herein as a "terminal." As illustrated, source S of transistor 308 is coupled to a node N1 and drain of transistor 308 is coupled to ground GRND. Although transistor 308 is illustrated in FIG. 3 as a P-channel MOSFET, the disclosure is not so limited. For example, in other embodiments, transistor 308 may include an N-channel MOSFET.

One input (e.g., an inverting input) of operational amplifier 302 may be coupled to node N1, and another input (e.g., a non-inverting input) of operational amplifier 302 may be configured to receive a reference voltage $V_{REF}$. Further, an output of operational amplifier 302 may be coupled to gate G of transistor 308.

Circuit 300 further includes a unity-gain feedback circuit 310 including an operational amplifier 312. As shown in FIG. 3, one input (e.g., a non-inverting input) of operational amplifier 312 may be coupled to node N1. Further, an output of operational amplifier 312 may be coupled to another input (e.g., an inverting input) of operational amplifier 312. Unity-gain feedback circuit 310, which is configured to provide a gain of one (i.e., an output voltage of operational amplifier 312 is equal to an input at the non-inverting input of operational amplifier 312). Thus, in the embodiment illustrated in FIG. 3, an output of operational amplifier 312 may be equal to a voltage $V_S$ at source S of transistor 308. Unity-gain feedback circuit 310 may also referred to herein as a "unity-gain buffer" or a "unity-gain voltage follower."

In some embodiments, unity-gain feedback circuit 310 may be used for testing and/or debugging purposes. In these embodiments, circuit 300 may be configured such that the input (e.g., the non-inverting input) of operational amplifier 312 may be selectively coupled to node N1.

As noted above, in some embodiments, circuit 300 may be an integrated circuit (e.g., formed on silicon), and, in these embodiments, circuit 300 may further include interfaces 314 and 316. Interface 314, which may include a probe pad, is coupled to gate G of transistor 308, and interface 316, which may include a probe pad, is coupled to the output of operational amplifier 312. Thus, in some embodiments, voltage $V_G$ at gate G of transistor 308 may be measured via interface 314 (also referred to herein as a "pad"), and voltage $V_S$ at source S of transistor 308 may be measured via interface 316 (also referred to herein as a "pad"). More specifically, voltage $V_G$ may be measured with an external instrument via interface 314, and voltage $V_S$ may be measured via with an external instrument via interface 316.

A contemplated operation of circuit 300 will now be described. In this example, to initiate a measurement mode, current I, which may be generated via current source 304, may be supplied to transistor 308 via current mirror 306. In some embodiments, during a measurement mode of circuit 300, a constant current (e.g., current I) may be supplied to transistor 308. Further, a drain of transistor 308 may be at, for example, zero volts and reference voltage $V_{REF}$ may be supplied to an input (e.g., non-inverting input) of operational amplifier 302. Voltage $V_{REF}$ may be any suitable voltage (e.g., 1 volt, 2 volts, 3 volts, etc.).

As will be appreciated, voltage $V_S$ may follow reference voltage $V_{REF}$. Stated another way, operational amplifier 302 may drive voltage $V_S$ to be substantially equal to reference voltage $V_{REF}$. Further, operational amplifier 302 may drive voltage $V_G$ at gate G of transistor 308 to the threshold voltage of transistor 308. As described more fully below, a time duration between a time the measurement mode is initiated and a time that voltage $V_G$ at gate G of transistor 308 is driven to the threshold voltage of transistor 308 may be referred to herein as a "measurement time" or a "setting time" of measurement circuit 300.

Moreover, voltage $V_G$ at gate G of transistor 308 may be measured via interface 314. Furthermore, in some embodiments, voltage $V_S$ at source S of transistor 308 may be measured via interface 316 (e.g., for debugging purposes to verify that voltage $V_S$ is substantially equal to reference voltage $V_{REF}$).

Circuit 300, which may measure a threshold voltage of a device (e.g., of transistor 308) (e.g., via a single measurement), may achieve sub-microsecond delay measurement performance across a wide range of currents (e.g., from substantially 10 nA to substantially 1 mA). Further, compared to some conventional circuits (e.g., circuit 100 of FIG. 1 and circuit 200 of FIG. 2), circuit 300 may not exhibit a high parasitic capacitance (e.g., 400 pF) pad on one or more critical switching nodes (e.g., node N1). Rather, circuit 300 may isolate the high parasitic capacitance (e.g., 400 pF) of pad 316 to circuit 310. Stated another way, the high parasitic capacitance (e.g., 400 pF) of pad 316, and associated measurement cables, may be isolated from node N1 and transistor 308.

Moreover, compared to some conventional circuits (e.g., circuit 200 of FIG. 2), a number of amplifying stages in a feedback path (i.e., including operational amplifier 302) of measurement circuit 300 may be reduced (e.g., to three). Thus, it may be easier to stabilize circuit 300 (e.g., across PVT variations), and design constraints for maintaining stability across PVT variations may be relaxed. Further, due to the reduction of the capacitance in the feedback path of circuit 300, an area of circuit 300 may be reduced compared to conventional circuits.

Figure 4:
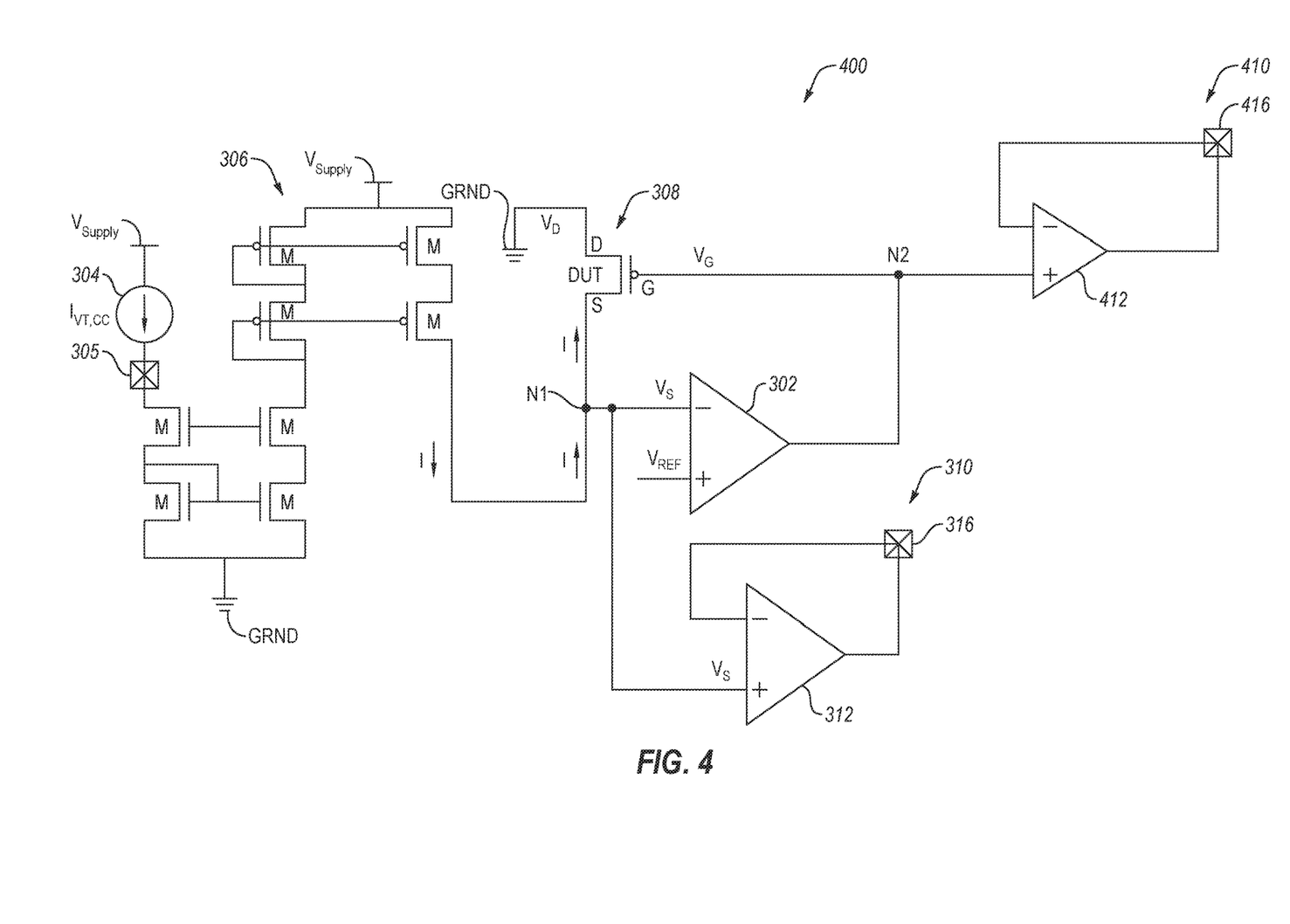
FIG. 4 illustrates another measurement circuit, according to one or more embodiments of the disclosure.

FIG. 4 illustrates another circuit 400, according to one or more embodiments of the disclosure. Circuit 400, which may also be referred to herein as a "measurement circuit," is similar to circuit 300 of FIG. 3. Like circuit 300, circuit 400 includes operational amplifier 302, current source 304, current mirror 306, transistor 308, and unity-gain feedback circuit 310. However, unlike circuit 300, circuit 400 does not include pad 314 coupled to gate G of transistor 308. Rather, circuit 400 further includes a unity-gain feedback circuit 410 including an operational amplifier 412.

As shown in FIG. 4, one input (e.g., a non-inverting input) of operational amplifier 412 may be coupled to a node N2, which is coupled to gate G of transistor 308. Further, an output of operational amplifier 412 may be coupled to another input (e.g., an inverting input) of operational amplifier 412. Unity-gain feedback circuit 410, which is configured to provide a gain of one (i.e., an output voltage of operational amplifier 412 is equal to an input at the non-inverting input of operational amplifier 412). Thus, in the embodiment illustrated in FIG. 4, an output of operational amplifier 412 may be equal to voltage $V_G$. Unity-gain feedback circuit 410 may also referred to herein as a "unity-gain buffer" or a "unity-gain voltage follower."

A contemplated operation of circuit 400 will now be described. In this example, to initiate a measurement mode, current I, which may be generated via current source 304, may be supplied to transistor 308 via current mirror 306. In some embodiments, during a measurement mode of circuit 400, a constant current (e.g., current I) may be supplied to transistor 308. Further, a drain of transistor 308 may be at, for example, zero volts and reference voltage $V_{REF}$ may be supplied to an input (e.g., non-inverting input) of operational amplifier 302.

As will be appreciated, voltage $V_S$ may follow reference voltage $V_{REF}$. Stated another way, operational amplifier 302 may drive voltage $V_S$ to be substantially equal to reference voltage $V_{REF}$. Further, operational amplifier 302 may drive the voltage at the gate of transistor 308 to the threshold voltage of transistor 308. A time duration between a time the measurement mode is initiated and a time that voltage $V_G$ at gate G of transistor 308 is driven to the threshold voltage of transistor 308 may be referred to herein as a "measurement time" or a "setting time" of measurement circuit 400.

Moreover, voltage $V_G$ at gate G of transistor 308 may be measured via interface 416 (also referred to herein as a "pad"). Furthermore, in some embodiments, voltage $V_S$ at source S of transistor 308 may be measured via interface 316 (e.g., to verify that voltage $V_S$ is substantially equal to reference voltage $V_{REF}$).

In some embodiments, unity-gain feedback circuits 310 and 410 may be used for testing and/or debugging purposes.

In these embodiments, circuit 400 may be configured such that the input (e.g., the non-inverting input) of operational amplifier 312 is selectively coupled (e.g., shorted together via a switch) to node N1 and the input (e.g., the non-inverting input) of operational amplifier 412 is selectively coupled (e.g., shorted together via a switch) to node N2.

Circuit 400, which may measure a threshold voltage of a device (e.g., of transistor 308) (e.g., via a single measurement), may achieve sub-microsecond delay measurement performance across a wide range of currents (e.g., from substantially 10 nA to substantially 1 mA). Further, compared to some conventional circuits (e.g., circuit 100 of FIG. 1 and circuit 200 of FIG. 2), circuit 400 may not exhibit a high parasitic capacitance (e.g., 400 pF) pad on one or more critical switching nodes (e.g., node N1 and/or node N2). Rather, circuit 400 may isolate the high parasitic capacitance (e.g., 400 pF) of pad 316 to circuit 310. Further, circuit 400 may further isolate the high parasitic capacitance (e.g., 400 pF) of pad 416 to circuit 410. Stated another way, the high parasitic capacitance of pads 316 and 416 may be isolated from node N1, node N2, and transistor 308.

Moreover, compared to some conventional circuits (e.g., circuit 200 of FIG. 2), a number of amplifying stages in a feedback path (i.e., including operational amplifier 302) of circuit 400 may be reduced (e.g., to three). Thus, it may be easier to stabilize circuit 400 (e.g., across PVT variations), and design constraints for maintaining stability across PVT variations may be relaxed. Further, due to the reduction of capacitance in the feedback path, an area of circuit 400 may be reduced compared to conventional circuits.

With reference to FIG. 3 and/or FIG. 4, in some embodiments, transistor 308 may be coupled to and/or may be part of additional circuitry (e.g., operational circuitry) (not shown). In these embodiments, a device and/or a system, which may include circuit 300 or circuit 400, and possibly the additional circuitry, may switch from an operational mode to a measurement mode, and vice versa. In some embodiments, upon switching from the operational mode to the measurement mode, a threshold voltage of transistor 308 may be measured.

Figure 5:
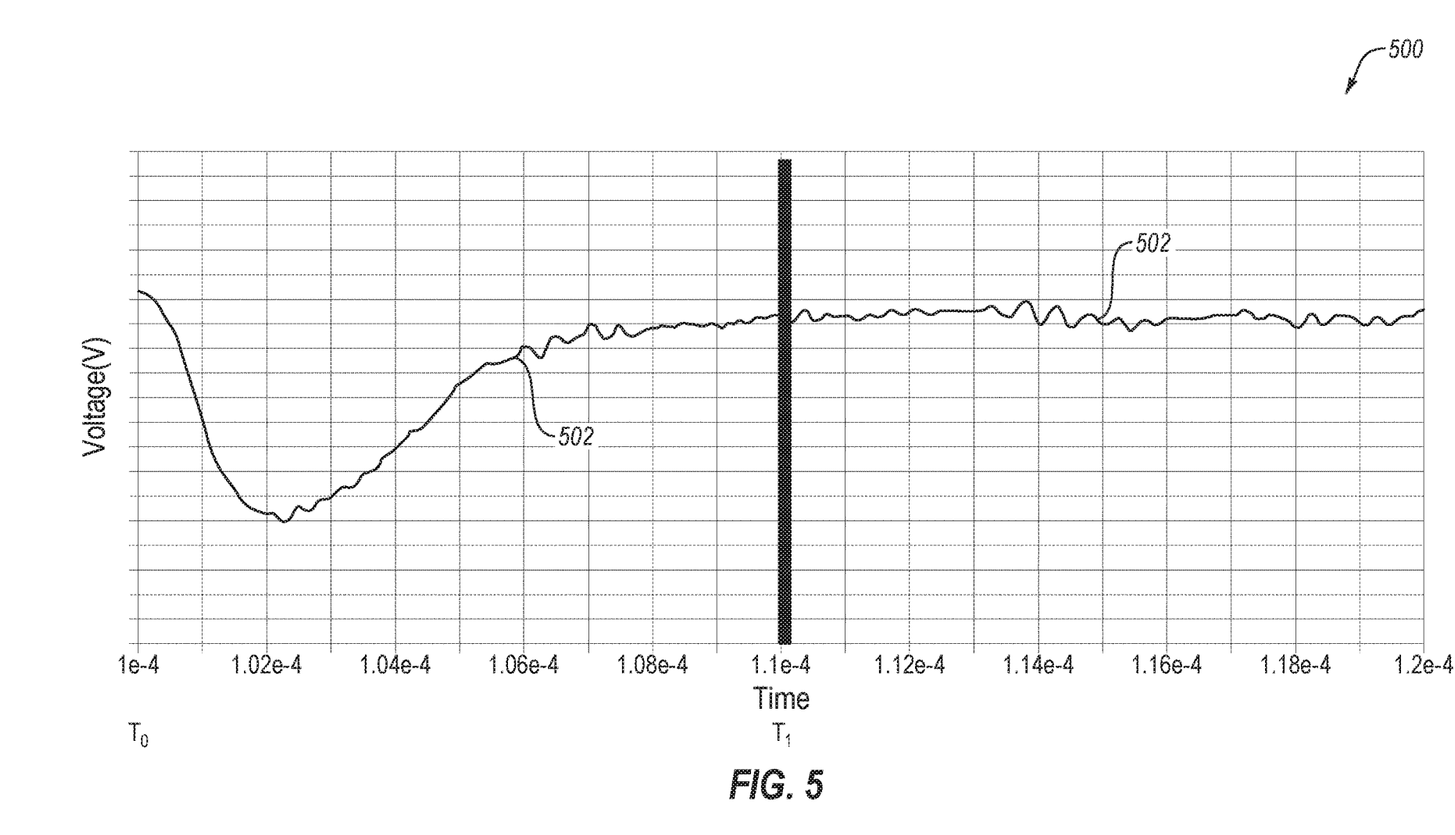
FIG. 5 illustrates a measurement verification.
Figure 6:
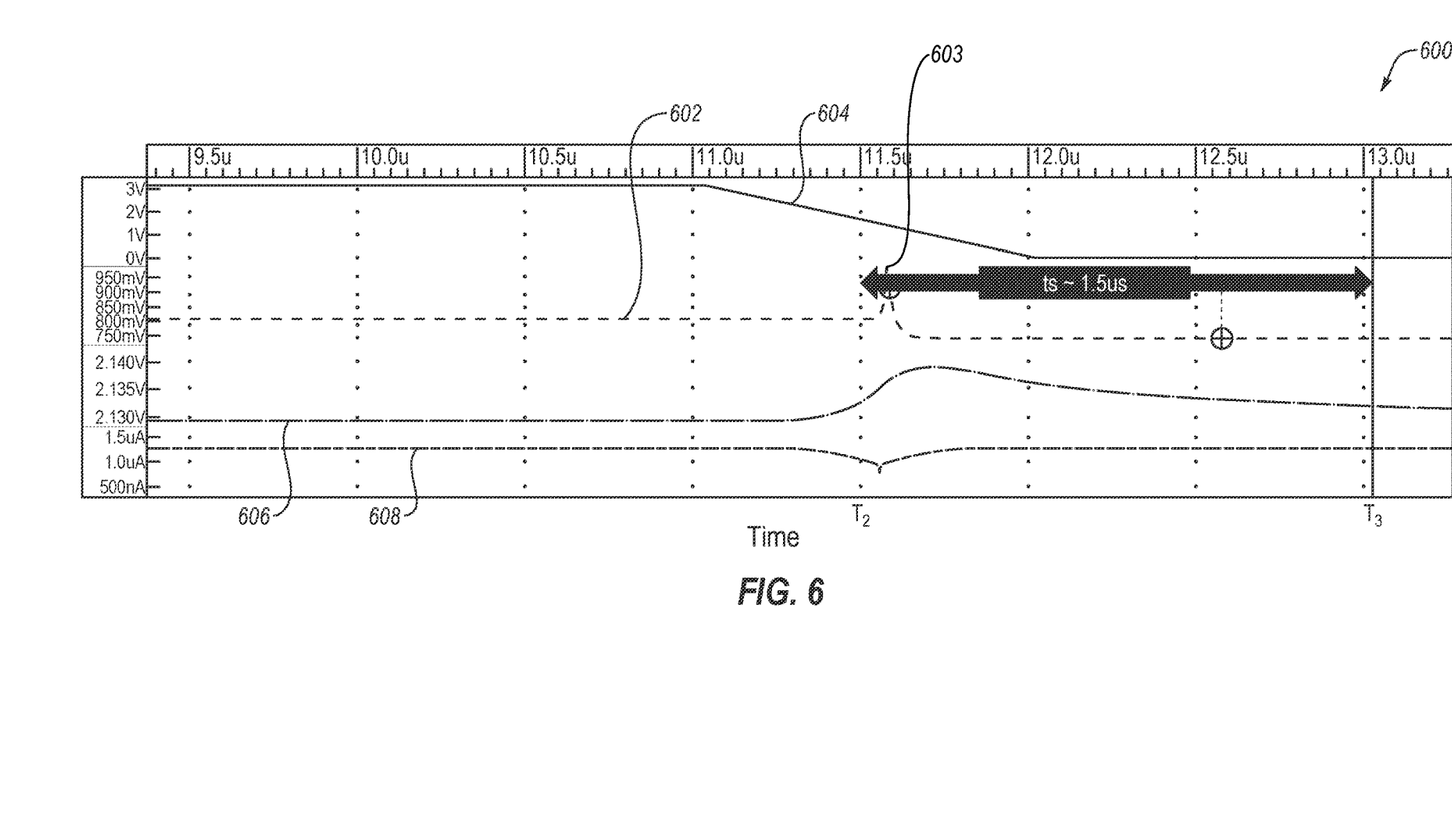
FIGS. 6 and 7 depict simulation results for various measurement circuit configurations.
Figure 7:
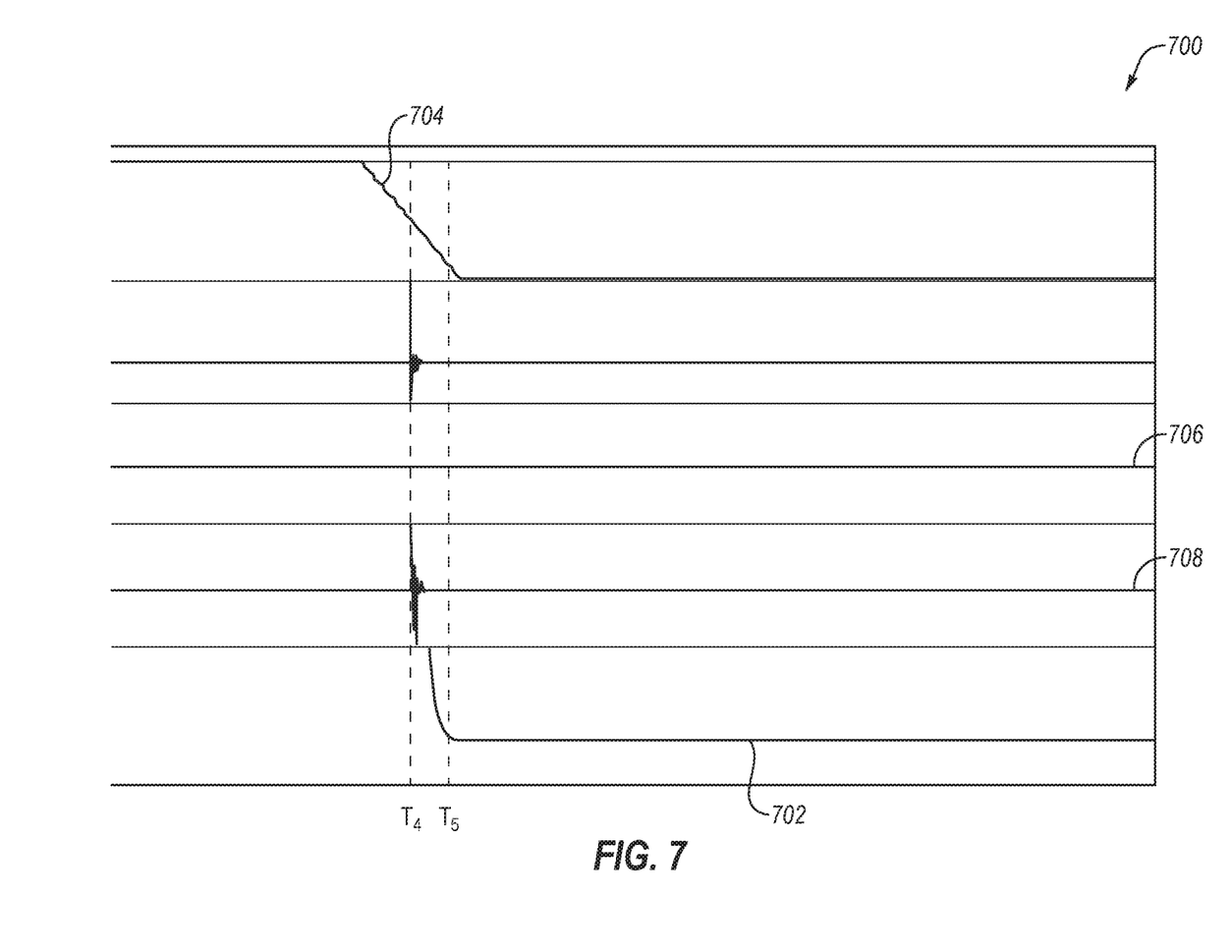

As described below, a time duration between a time the measurement mode is initiated and a time that a voltage at a gate of a transistor (a DUT) reaches a threshold voltage may be referred to herein as a "measurement time" or a "setting time." FIG. 5 illustrates a measurement verification and FIGS. 6 and 7 depict simulation results for transistor threshold voltages for various circuit configurations. More specifically, FIG. 5 is a plot 500 depicting measurement results for a transistor (e.g., transistor 308) of a measurement circuit (e.g., circuit 300 of FIG. 3 or circuit 400 of FIG. 4) (e.g., formed on silicon). Yet more specifically, plot 500 depicts a gate voltage (indicated by signal 502) of the transistor measured over time. A voltage indicated by signal 502 at time $T_0$ may represent the voltage applied to a gate of the transistor (e.g., gate G of transistor 308; see FIG. 3 and/or FIG. 4) of the measurement circuit during an operational mode. Further, at time $T_0$, the measurement circuit (e.g., circuit 300 of FIG. 3 or circuit 400 of FIG. 4) switches from the operational mode to a measurement mode. Moreover, the voltage indicated by signal 502 at time $T_1$ may represent the threshold voltage of the transistor (e.g., the threshold voltage of transistor 308; see FIG. 3 and/or FIG. 4). As shown in plot 500, a settling time (e.g., from time $T_0$ to time $T_1$) of the gate voltage is approximately 10 microseconds (e.g., with pad and associated measurement cables having a parasitic capacitance of approximately 400 pF).

FIG. 6 is a plot 600 depicting measurement results for a transistor (e.g., transistor 308) of a measurement circuit that is not formed on a semiconductor material (e.g., circuit 300 of FIG. 3 or circuit 400 of FIG. 4 without pads). More specifically, plot 600 depicts a gate voltage (indicated by signal 602) of the transistor measured over time. A voltage indicated by signal 602 prior to time $T_2$ may represent the voltage applied to a gate of the transistor (e.g., gate G of transistor 308; see FIG. 3 and/or FIG. 4) of the measurement circuit during an operational mode. Further, at time $T_2$, the measurement circuitry (e.g., circuit 300 of FIG. 3 or circuit 400 of FIG. 4) switches from the operational mode to a measurement mode. Moreover, the voltage indicated by signal 602 at time $T_3$ may represent the threshold voltage of the transistor (e.g., the threshold voltage of transistor 308; see FIG. 3 and/or FIG. 4). As shown in plot 600, a settling time (e.g., from time $T_2$ to time $T_3$) of the gate voltage is approximately 1.5 microseconds. The reduction in setting time compared to plot 500 of FIG. 5 may be at least partially due to the reduction of parasitic capacitance (e.g., due to inaccuracies in the estimation of layout load, resistance, and capacitance, when compared to the actual resistance and capacitance on silicon).

Plot 600 further depicts a control signal (indicate by signal 604), which is conveyed to the measurement circuit (i.e., including the transistor), for switching the measurement circuit from the operational mode to the measurement mode. A spike 603 in signal 602 may be due to switching from the operational mode to the measurement mode. Plot 600 further depicts a voltage (indicated by signal 606) at a current source (e.g., current source 304 of FIG. 3 or FIG. 4) of the measurement circuit. Plot 600 also depicts a current (indicated by signal 608) through a device under test (e.g., transistor 308 of FIG. 3) of the measurement circuit.

According to some embodiments, measurement circuitry (e.g., circuit 300 of FIG. 3 and/or circuit 400 of FIG. 4) may share one or more sources (e.g., a common ground, a common supply line, a common power line, etc.) with operational circuitry and/or switching circuitry (e.g., digital circuitry for switching from an operational mode to a measurement mode). Sharing a source (e.g., a common ground and/or a supply line) may cause glitches (e.g., artifact) and/or may cause further delays in measurement times of the measurement circuitry. In other embodiments, measurement circuitry (e.g., circuit 300 of FIG. 3 and/or circuit 400 of FIG. 4) may include one or more dedicated sources. More specifically, the measurement circuit may include a dedicated ground, a dedicated supply line and/or a dedicated power line (e.g., the one or more sources are not shared with other circuitry, such as operational or switching circuitry), resulting in improved performance of the measurement circuitry.

FIG. 7 is a plot 700 depicting simulation results for a transistor (e.g., transistor 308) of a measurement circuit (e.g., circuit 300 of FIG. 3 or circuit 400 of FIG. 4), wherein the measurement circuit includes a dedicated ground. More specifically, plot 700 depicts a gate voltage (indicated by signal 702) of a transistor measured over time. A voltage indicated by signal 702 prior to time $T_4$ may represent the voltage applied to a gate of the transistor (e.g., gate G of transistor 308; see FIG. 3 and/or FIG. 4) of the measurement circuit during an operational mode. Further, at time $T_4$, the measurement circuit (e.g., circuit 300 of FIG. 3 or circuit 400 of FIG. 4) switches from the operational mode to a measurement mode. Moreover, the voltage indicated by signal 702 at time $T_5$ may represent the threshold voltage of the transistor (e.g., the threshold voltage of transistor 308; see FIG. 3 and/or FIG. 4). A settling time (e.g., from time $T_4$ to time $T_5$) of the gate voltage is approximately 370 microseconds (e.g., with pad and associated measurement cables having a parasitic capacitance of approximately 400 pF).

Plot 700 further depicts a control signal (indicate by signal 704), which is conveyed to the measurement circuit (i.e., including the transistor), for switching the measurement circuit from the operational mode to the measurement mode. Plot 700 also depicts a voltage (indicated by signal 706) at a current source (e.g., current source 304 of FIG. 3) of the measurement circuit. Furthermore, plot 700 also depicts a current (indicated by signal 708) through a device under test (e.g., transistor 308 of FIG. 3) of the measurement circuit.

Figure 8:
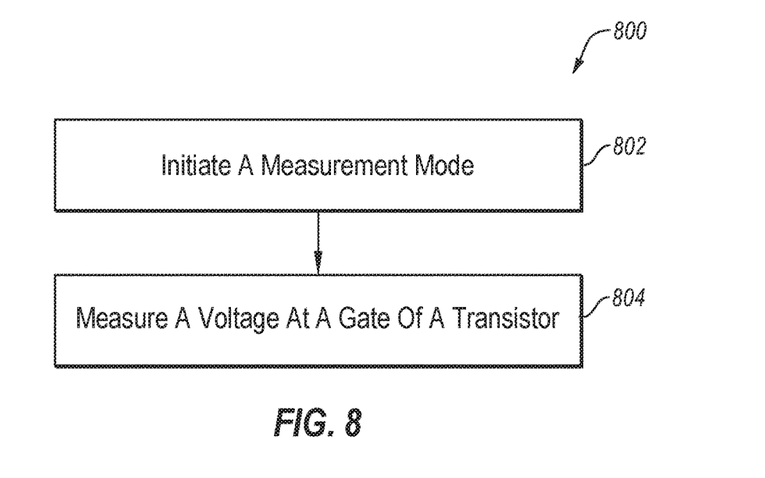
FIG. 8 is a flowchart illustrating an example method of measuring a threshold voltage of a transistor.

FIG. 8 is a flowchart of an example method 800 for measuring a threshold voltage of a transistor. Method 800 may be arranged in accordance with at least one embodiment described in the present disclosure. Method 800 may be performed, in some embodiments, by a device or system, such as circuit 300 of FIG. 3, circuit 400 of FIG. 4, device 850 of FIG. 9, semiconductor device 900 of FIG. 10, and/or system 1000 of FIG. 11, or another device or system. Although illustrated as discrete blocks, various blocks may be divided into additional blocks, combined into fewer blocks, or eliminated, depending on the desired implementation.

Method 800 may begin at block 802, wherein a measurement mode for a circuit may be initiated, and method 800 may proceed to block 804. Initiating the measurement mode may include, for example, switching the circuit from an operational (stress) mode to the measurement mode. Further, initiating the measurement mode may include, for example, conveying a current and/or a voltage to the circuit. More specifically, for example, with reference to FIGS. 3 and 4, a current I, which may be generated via a current source (e.g., current source 304) and a current mirror (e.g., current mirror 306), may be supplied to transistor 308 of either circuit 300 or circuit 400. Further, a reference voltage may be supplied to the circuit. More specifically, for example, with continued reference to FIGS. 3 and/or 4, reference voltage $V_{REF}$ may be supplied to an input of operational amplifier 312.

At block 804, a voltage at a gate of transistor may be measured. For example, in some embodiments, voltage $V_G$ at gate G of transistor 308 may be measured via pad 314 (see FIG. 3). In other embodiments, voltage $V_G$ at gate G of transistor 308 may be measured via unity-gain voltage follower 410 (see FIG. 4). More specifically, in this embodiment, gate G of transistor 308 may be coupled to an input of operational amplifier 412 of unity-gain voltage follower 410, and an output of operational amplifier 412 may be measured to determine voltage $V_G$ at gate G of transistor 308. For example, the voltage at the output of operational amplifier 412 may be measured via pad 416.

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

For example, in various embodiments, a voltage at source of the transistor may be measured. More specifically, according to some embodiments, a voltage at an output of a unity-gain voltage follower, which is coupled to the source of the transistor, may be measured to determine a source voltage of the transistor. For example, with reference to FIG. 3 and/or FIG. 4, a voltage at an output of operational amplifier 312 may be measured to determine voltage $V_S$ at source S of transistor 308. For example, the voltage at the output of operational amplifier 312 may be measured via pad 316. As another example, a current through the transistor (e.g., transistor 308) may be measured and/or a voltage at a current source (e.g., current source 304; see FIG. 3 and/or FIG. 4) may be measured.

Figure 9:
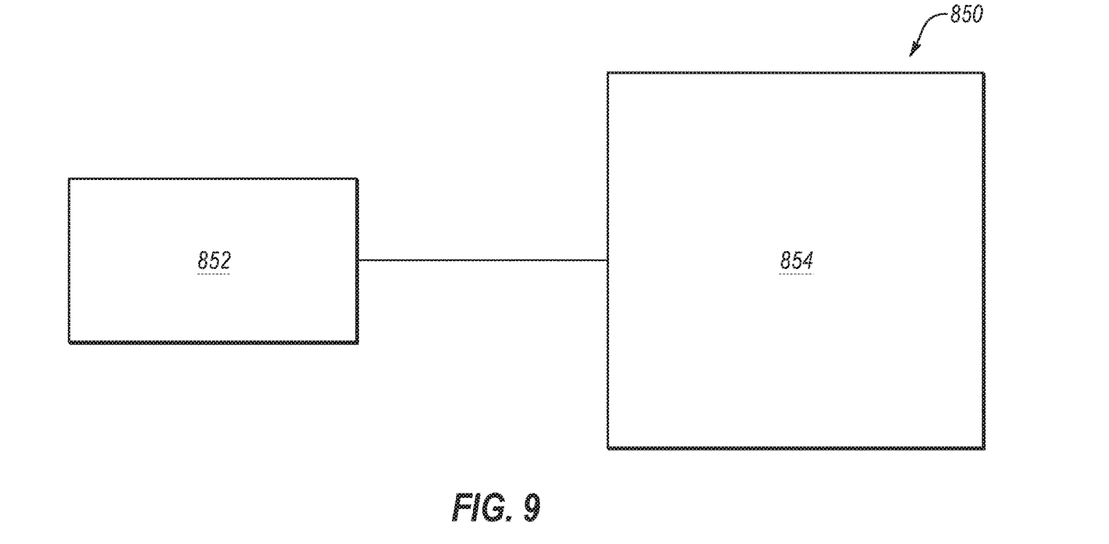
FIG. 9 depicts a device including a measurement device and an array, according to various embodiments of the present disclosure.

FIG. 9 depicts a device 850 including a measurement device 852 and an array 854, according to various embodiments of the present disclosure. For example, array 854 may include an array of transistors, and measurement device 852 may include circuitry for measuring a threshold voltage of one or more transistors of array 854. More specifically, for example, measurement device 852 may include one or more of circuit 300 (see FIG. 3), one or more of circuit 400 (see FIG. 4), or any combination thereof. Further, in some embodiments, array 854 may include a memory array (e.g., a CMOS DRAM array) including a number of memory cells, wherein each cell may include at least one transistor. In an example wherein array 854 includes a 1 megabit (Mb) array, a threshold voltage of a number of transistors of array 854 may be measured in approximately one second. Although measurement device 852 is depicted as being external to array 854, embodiments of the disclosure are not so limited. Rather, in other embodiments, at least a portion of measurement device 852 may be part of array 854.

In some embodiments, measurement device 852 may include decoding circuitry to, for example, access and/or process one or more signals (e.g., voltage signals) to determine a variability of array 854 (e.g., determine threshold voltages of one or more transistors of array 854 across PVT measurements). Further, for example, measurement device 852 may be utilized to analyze stress induced (e.g., electrical stress induced) variability of array 854.

A semiconductor device is also disclosed. The semiconductor device, which may include a memory device, may include one or more arrays (e.g., memory arrays). For example, each array may include an array of transistors, wherein each transistor is associated with (e.g., part of) a measurement circuit (e.g., measurement circuit 300 of FIG. 3 or measurement circuit 400 of FIG. 4).

Figure 10:
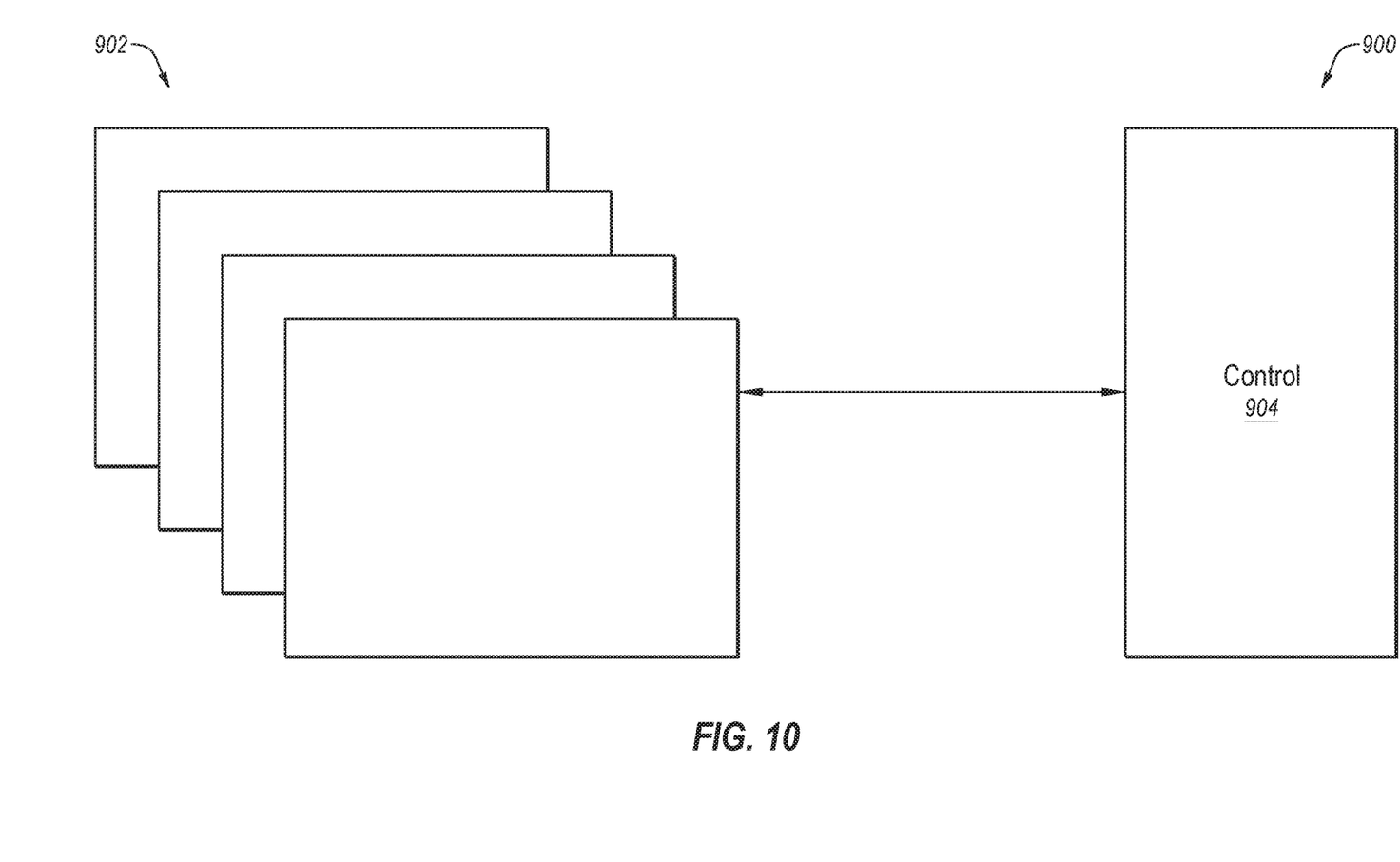
FIG. 10 is a simplified block diagram of a semiconductor device implemented according to one or more embodiments described herein.

FIG. 10 is a simplified block diagram of a semiconductor device 900 implemented according to one or more embodiments described herein. Semiconductor device 900 includes a memory array 902 and a control logic component 904. Control logic component 904 may be operatively coupled with memory array 902 so as to read, write, or re-fresh any or all memory cells within memory array 902. Accordingly, a semiconductor device comprising a memory array is disclosed. Memory array 902 may include a number of memory cells (e.g., DRAM cells). Each memory cell of the number of memory cells may include a transistor (e.g., transistor 308; see FIG. 3 and/or FIG. 4). Further, each cell may include and/or be associated with (e.g., coupled to) a measurement circuit (e.g., circuit 300 of FIG. 3 or circuit 400 of FIG. 4) for measuring a threshold voltage of the transistor.

A system is also disclosed. The system includes a memory array of memory cells. Each memory cell may include a transistor (e.g., an access transistor) and a storage element operably coupled with the transistor. Further, in some embodiments, each memory cell may include and/or be associated with (e.g., coupled to) one or more measurement circuits, as described herein.

Figure 11:
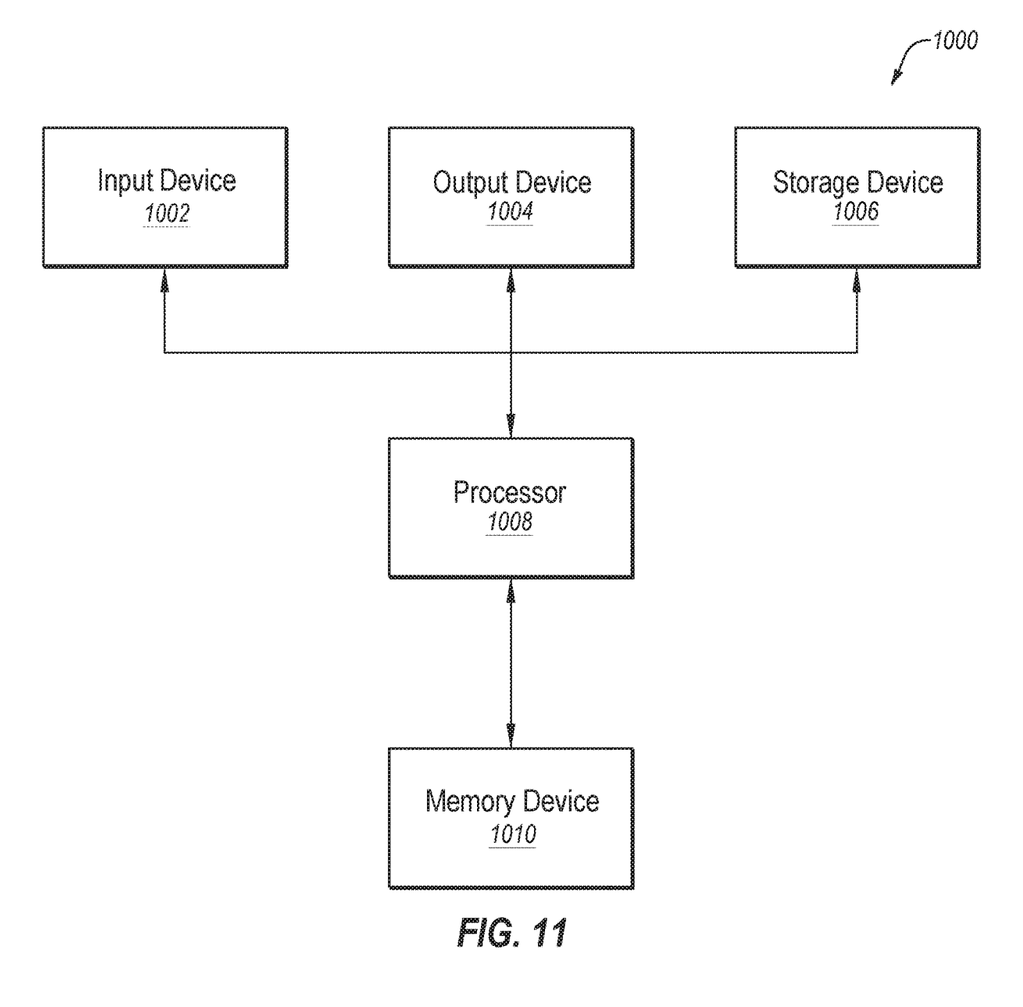
FIG. 11 is a simplified block diagram of an electronic system implemented according to one or more embodiments described herein.

FIG. 11 is a simplified block diagram of an electronic system 1000 implemented according to one or more embodiments described herein. Electronic system 1000 includes at least one input device 1002. Input device 1002 may be a keyboard, a mouse, or a touch screen. Electronic system 1000 further includes at least one output device 1004. Output device 1004 may be a monitor, touch screen, or speaker. Input device 1002 and output device 1004 are not necessarily separable from one another. Electronic system 1000 further includes a storage device 1006. Input device 1002, output device 1004, and storage device 1006 are coupled to a processor 1008. Electronic system 1000 further includes a memory device 1010 coupled to processor 1008. Memory device 1010 includes at least one memory cell (e.g., an array of memory cells), wherein one or more memory cells of memory device 1010 may include a transistor. Further, in some embodiments, one or more memory cells may include and/or may be associated with (e.g., coupled to) one or more measurement circuits according to one or more embodiments described herein. Electronic system 1000 may include a computing, processing, industrial, or consumer product. For example, without limitation, electronic system 1000 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

In contrast to some conventional devices, various embodiments disclosed herein may achieve voltage threshold measurements across a wide range of currents (e.g., from substantially 10 nA to substantially 1 mA) with sub-microsecond delays. Further, compared to some conventional circuits (e.g., circuit 100 of FIG. 1 and circuit 200 of FIG. 2), various embodiments may isolate high parasitic capacitances from a feedback path of a measurement circuit (e.g., measurement circuit 300 of FIG. 3 and/or measurement circuit of FIG. 4). More specifically, high parasitic capacitances may be isolated via one or more unity-gain voltage followers (e.g., unity-gain voltage follower 310 and/or unity-gain voltage follower 410; see FIGS. 3 and 4) and/or isolated through a current mirror.

Moreover, compared to some conventional circuits (e.g., circuit 200 of FIG. 2), a number of amplifying stages in the feedback path of a measurement circuit (e.g., measurement circuit 300 of FIG. 3 and/or measurement circuit of FIG. 4) may be reduced (e.g., to three). Accordingly, stabilization of the measurement circuit (e.g., across PVT variations) may be simplified, and design constraints for maintaining stability across the PVT variations may be relaxed. Further, due to the reduction of capacitance in a feedback path of a measurement circuit, an area required for the measurement circuit may also be reduced compared to conventional circuits.

Various embodiments may be used for detecting and/or modeling Negative Bias Temperature Instability (NBTI), which may cause an increase in a threshold of a FET. Validation of NBTI models, wherein measurement delay may be critical, may be carried out via one or more embodiments disclosed herein (e.g., circuit 300 of FIG. 3 and/or circuit 400 of FIG. 4). More specifically, various embodiments may allow for single point extraction of a transistor threshold voltage, with negligible NBTI recovery, in contrast to conventional devices that extract a threshold voltage from an "on" current and a subthreshold slope.

One or more embodiments of the present disclosure include a circuit. The circuit may include a transistor having a first terminal, a second terminal, and a third terminal, wherein the first terminal is coupled to a first reference voltage. The circuit may further include a first operational amplifier including a first input coupled to the second terminal of the transistor and an output coupled to the third terminal of the transistor. The first operational amplifier may further include a second input configured to receive a second reference voltage. The circuit may also include a first unity-gain voltage follower including a second operational amplifier having a first input coupled to the first input of the first operational amplifier.

Some embodiments of the present disclosure include a semiconductor device. The semiconductor device may include a memory array including at least one measurement circuit. The at least one measurement circuit may include a transistor and a first operational amplifier. The first operational amplifier may include a first input coupled to one of a source and a drain of the transistor and a second input configured to receive a reference voltage. The first operational amplifier may also include an output coupled to a gate of the transistor. Further, the at least one measurement circuit may include a second operational amplifier. The second operational amplifier may include a first input coupled to the first input of the first operational amplifier. Moreover, the second operational amplifier may include a second input coupled to an output of the second operational amplifier.

Additional embodiments of the present disclosure include an electronic system. The electronic system may include at least one input device, at least one output device, at least one processor device operably coupled to the input device and the output device, and at least one semiconductor device operably coupled to the at least one processor device. The semiconductor device may include one or more measurement circuits. Each measurement circuit of the one or more measurement circuits may include a transistor having a gate, a source, and a drain. Each measurement circuit may further include an operational amplifier including a first input coupled to the source of the transistor, a second input configured to receive a reference voltage, and an output coupled to a gate of the transistor. Each measurement circuit may also include a first probe pad for enabling a voltage at the gate of the transistor to be measured.

Other embodiments of the present disclosure may include a method of measuring a threshold voltage of a transistor. Such a method may include initiating a measurement mode of a circuit including a transistor. The method may also include generating an output from a unity-gain voltage follower having an input coupled to the transistor. The method may further include measuring a threshold voltage of the transistor via an interface coupled to an output of the unity-gain voltage follower.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc.," or "one or more of A, B, and C, etc.," is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A circuit, comprising:
a transistor having a first terminal, a second terminal, and a third terminal, the first terminal coupled to a first reference voltage;
a first operational amplifier including a first input coupled to the third terminal of the transistor and an output coupled to the second terminal of the transistor, the first operational amplifier further including a second input configured to receive a second reference voltage; and
a first unity-gain voltage follower including a second operational amplifier having a first input coupled to the first input of the first operational amplifier.

2. The circuit of claim 1, wherein the first terminal comprises a drain of the transistor, the second terminal comprises a gate of the transistor, and the third terminal comprises a source of the transistor.

3. The circuit of claim 2, further comprising:
a first interface for enabling at least one of a voltage and a current at the second terminal of the transistor to be measured; and
a second interface for enabling at least one of a voltage and a current at an output of the second operational amplifier to be measured.

4. The circuit of claim 3, wherein each of the first interface and the second interface comprise a probe pad.

5. The circuit of claim 1, wherein the third terminal of the transistor is configured to receive a current.

6. The circuit of claim 5, further comprising a current mirror configured for supplying the current to the third terminal of the transistor.

7. The circuit of claim 1, further comprising a second unity-gain voltage follower including a third operational amplifier having a first input coupled to the second terminal of the transistor.

8. The circuit of claim 7, further comprising:
a first interface for enabling at least one of a voltage and a current at an output of the third operational amplifier to be measured; and
a second interface for enabling at least one of a voltage and a current at an output of the second operational amplifier to be measured.

9. The circuit of claim 8, wherein each of the first interface and the second interface comprise a probe pad.

10. The circuit of claim 1, wherein the first reference voltage comprises a ground.

11. A semiconductor device, comprising:
a memory array including at least one measurement circuit, the at least one measurement circuit including:
a transistor including one of a source and a drain coupled to a reference voltage;
a first operational amplifier including:
a first input coupled to the other of the one of the source and the drain of the transistor;
a second input configured to receive another reference voltage; and
an output coupled to a gate of the transistor; and
a second operational amplifier including:
a first input coupled to the first input of the first operational amplifier; and
a second input coupled to an output of the second operational amplifier.

12. The semiconductor device of claim 11, further comprising a first probe pad for sensing a voltage at the gate of the transistor and a second probe pad for sensing a voltage at the source of the transistor.

13. The semiconductor device of claim 11, further comprising a third operational amplifier including:
a first input coupled to the gate of the transistor; and
a second input coupled to an output of the third operational amplifier.

14. The semiconductor device of claim 13, further comprising a first probe pad for sensing a voltage at an output of the third operational amplifier and a second probe pad for sensing a voltage at the source of the transistor.

15. The semiconductor device of claim 11, further comprising a current mirror configured to receive a current from a current source and supply the current to the transistor.

16. The semiconductor device of claim 15, wherein the current source comprises an external current source.

17. An electronic system, comprising:
at least one input device;
at least one output device;
at least one processor device operably coupled to the input device and the output device; and
at least one semiconductor device operably coupled to the at least one processor device and comprising one or more measurement circuits, each measurement circuit of the one or more measurement circuits including:
a transistor having a gate, a source, and a drain, the drain coupled to a first reference voltage;
an operational amplifier including:
a first input coupled to the source of the transistor;
a second input configured to receive a second reference voltage; and
an output coupled to a gate of the transistor; and
a first probe pad for enabling a voltage at the gate of the transistor to be measured.

18. The electronic system of claim 17, further comprising:
a unity-gain circuit having an input coupled to the source of the transistor; and
a second probe pad for enabling a voltage at an output of the unity-gain circuit to be measured.

19. The electronic system of claim 17, further comprising a current mirror coupled to the source of the transistor.

20. The electronic system of claim 17, further comprising a unity-gain circuit having an input coupled to the gate of the transistor, wherein the first probe pad is configured to enable a voltage at an output of the unity-gain circuit to be measured.

21. A method of measuring a threshold voltage of a transistor, comprising:
initiating a measurement mode of a circuit including a transistor having a first terminal coupled to a first reference voltage;
generating an output from a unity-gain voltage follower having an input coupled to a second terminal of the transistor; and
measuring a threshold voltage of the transistor via an interface coupled to an output of the unity-gain voltage follower.

22. The method of claim 21, wherein initiating the measurement mode comprises:
supplying a current to the transistor; and
supplying a second reference voltage to an input of an operational amplifier having an output coupled to a gate of the transistor.

23. The method of claim 21, measuring the threshold voltage via the interface comprises measuring the threshold voltage via a probe pad.

* * * * *